United States Patent [19]

Bokisa et al.

[11] Patent Number: 6,063,172
[45] Date of Patent: May 16, 2000

[54] AQUEOUS IMMERSION PLATING BATH AND METHOD FOR PLATING

[75] Inventors: George S. Bokisa, North Olmsted; William J. Willis, North Royalton, both of Ohio

[73] Assignee: McGean-Rohco, Inc., Cleveland, Ohio

[21] Appl. No.: 09/170,527

[22] Filed: Oct. 13, 1998

[51] Int. Cl.[7] ............................. C23C 18/31; B05D 5/12
[52] U.S. Cl. .................... 106/1.22; 106/1.25; 427/98; 427/437; 427/443.1
[58] Field of Search ................... 106/1.22, 1.25; 427/98, 437, 443.1

[56] References Cited

U.S. PATENT DOCUMENTS

| | | | |
|---|---|---|---|
| 3,793,038 | 2/1974 | Maguire | 106/1.23 |
| 4,139,425 | 2/1979 | Eckles et al. | 204/43 |
| 4,169,772 | 10/1979 | Lowery et al. | 204/55 |
| 4,662,999 | 5/1987 | Opaskar et al. | 204/44.4 |
| 4,715,894 | 12/1987 | Holtzman et al. | 106/1.22 |
| 4,882,202 | 11/1989 | Holtzman et al. | 427/98 |
| 4,885,064 | 12/1989 | Bokisa et al. | 204/44.4 |
| 5,160,422 | 11/1992 | Nishimura et al. | 205/254 |
| 5,196,053 | 3/1993 | Dodd et al. | 106/1.22 |
| 5,554,211 | 9/1996 | Bokisa et al. | 106/1.22 |

*Primary Examiner*—Helene Klemanski
*Attorney, Agent, or Firm*—Renner, Otto, Boisselle & Sklar

[57] ABSTRACT

It has now been found that one or more metals selected from the group consisting of tin, lead, bismuth, indium, gallium and germanium may be deposited onto a metal surface utilizing an aqueous electroless plating bath which comprises (A) at least one bath-soluble metal salt selected from the group consisting of stannous salts, lead salts, bismuth salts, indium salts, gallium salts, and germanium salts;

(B) at least one complexing agent selected from the group consisting of thiourea compounds and imidazole thiones, and (C) at least one amidine.

Preferably, the aqueous plating baths also contain at least one acid, and the baths optionally may contain one or more surfactants. The incorporation of the amidine into the plating baths results in a solution exhibiting desirable plating characteristics and increased copper holding power.

34 Claims, No Drawings

AQUEOUS IMMERSION PLATING BATH AND METHOD FOR PLATING

FIELD OF THE INVENTION

This invention relates to a plating bath for depositing one or more metals selected from the group consisting of tin, lead, bismuth, indium, gallium and germanium onto a metal surface such as on copper or copper alloys used for electrodes or various electronic circuit elements. More particularly, this invention relates to immersion plating of one or more of the above metals on copper, copper alloys, and other metals by chemical displacement using an immersion, a spray, a flood or a cascade application process. Still more particularly, this invention relates to the use of such plating solutions in the manufacture of printed circuitboards.

BACKGROUND OF THE INVENTION

Coatings of tin, lead, bismuth, and alloys thereof have been applied to surfaces of copper and copper-based alloys by displacement plating such as by immersion plating techniques. Chemical displacement plating has been used in the manufacture of printed circuitboards (PCB's) and particularly multilayer printed circuitboards. Printed circuitboards generally comprise a non-conducting or dielectric layer such as a fiberglass/epoxy sheet which is clad with a metal conductive layer such as copper on one or both surfaces. The metal layer on the PCB, before processing, typically is a continuous layer of copper which may be interrupted by a pattern of plated through holes linking both surfaces of the board. During processing, selected portions of the copper layer are removed to form a raised copper circuit image pattern. Multilayer PCB's are typically constructed by interleaving imaged conductive layers such as one containing copper with dielectric adhesive layers such as a partially cured B-stage resin, i.e., a prepreg, into a multilayer sandwich which is then bonded together by applying heat and pressure. Production of these types of PCB's is described in "Printed Circuits Handbook," Third Edition, Edited by C. F. Coombs, Jr., McGraw-Hill, 1988, which is incorporated herein by reference. Since the conductive layer with a smooth copper surface does not bond well to the prepreg, copper surface treatments have been developed to increase the bond strength between the layers of the multilayer PCB sandwich. One example of a copper surface treatment is the use of immersion tin and tin alloys as a bonding medium for multilayer circuits as disclosed by Holtzman et al (U.S. Pat. Nos. 4,715,894 and 4,882,202). In these patents, an immersion tin composition is disclosed containing thiourea compounds and urea compounds to displacement plate the copper surface of each PCB with tin by the immersion process prior to laminating them to form a multilayer board.

U.S. Pat. No. 5,196,053 (Dodd et al) describes displacement tin plating, and more particularly, the use of a complexing agent which is an imidazole-2-thione compound. This complexing agent is utilized in place of thiourea which is described in the prior art. More particularly, U.S. Pat. No. 5,196,053 describes an aqueous plating solution for displacement plating of a substrate metal surface with another metal, and the plating solution comprises (i) a metal ion of a free metal, wherein the free metal is different from the metal of the substrate surface;
(ii) a complexing agent which is an imidazole-2-thione compound; and
(iii) an acid. The acids that may be used include organic acids and inorganic acids based on sulfur, phosphorus, halogens, or mixtures thereof. The sulfur-based mineral acids are preferred, and examples of these include sulfuric acid and sulfamic acid. A mixture of sulfuric and hypophosphorous acids is particularly preferred. Examples of organic acids that can be used include monocarboxylic or dicarboxylic acids having up to about 6 carbon atoms such as formic acid, acetic acid, malic acid, maleic acid, etc.

U.S. Pat. No. 5,160,422 (Nishimura et al) relates to plating baths for immersion tin-lead plating on copper or copper alloys. In addition to tin and lead, these baths contain an organic sulfo compound such as an alkane sulfonic acid or a hydroxy alkane sulfonic acid, and thiourea. Fluoborates also may be included in these plating solutions.

U.S. Pat. No. 5,554,211 describes plating baths for depositing tin, lead, bismuth, indium, gallium and/or germanium onto metal surfaces wherein the baths contain metal salts of at least one of the named metals, at least one acid selected from fluoboric acid, alkane sulfonic acids and alkanol sulfonic acids, and a complexing agent which is an imidazoline-2-thione. Optionally the baths can contain one or more surfactants.

SUMMARY OF THE INVENTION

It has now been found that one or more metals selected from the group consisting of tin, lead, bismuth, indium, gallium and germanium may be deposited onto a metal surface utilizing an aqueous electroless plating bath which comprises (A) at least one bath-soluble metal salt selected from the group consisting of stannous salts, lead salts, bismuth salts, indium salts, gallium salts, and germanium salts;
(B) at least one complexing agent selected from the group consisting of thiourea compounds and imidazole thiones, and p1 (C) at least one amidine. Preferably, the aqueous plating baths also contain at least one acid, and the baths optionally may contain one or more surfactants. The incorporation of the amidine into the plating baths results in a solution exhibiting desirable plating characteristics and increased copper holding power.

DESCRIPTION OF THE PREFERRED EMBODIMENTS

The plating baths of the present invention comprise one or more metals selected from tin, lead, bismuth, indium, gallium and germanium. Thus, the plating baths may contain tin or lead, bismuth, indium, gallium and germanium, or mixtures of metals such as tin/lead, tin/bismuth, tin/indium, lead/bismuth, tin/germanium, indium/gallium, tin/lead/bismuth, tin/gallium/germanium, etc. The metals are present in the plating bath as water-soluble salts including the oxides, sulfates, nitrates, halides, formates, acetates, fluoborates, fluosilicates, alkane sulfonates and alkanol sulfonates. In one preferred embodiment, the anion of the metal salt corresponds to the anion of the acid used in the plating bath. For example, when sulfuric acid is used as the acid, the salts may be, for example, stannous sulfate, bismuth sulfate, etc. When the acid is fluoboric acid, the salts may be, for example, stannous fluoborate, lead fluoborate, bismuth fluoborate, indium fluoborate, gallium fluoborate and germanium fluoborate. When the acid used in the bath is an alkane or an alkanol sulfonic acid, the soluble metal salt may be, for example, tin methane sulfonate, lead methane sulfonate, bismuth methane sulfonate, indium methane sulfonate, etc. When tin is present in the bath, it is added usually as a stannous salt such as, for example, stannous sulfate, stannous acetate, stannous sulfamate, stannous methane sulfonate. Tin can also be added as stannic salts such as stannic oxide. Lead is usually added to the bath as a plumbous salt.

The amount of tin, lead, bismuth, indium, gallium, germanium, or mixtures of such metals present in the plating solutions of the present invention may be varied over a wide range such as from about 1 to about 70 grams or even 100 grams of metal per liter of solution. In one embodiment, the preferred range is from about 5 to about 50 and more often from about 5 to about 25 grams of metal per liter of solution. Higher levels of metal may be included in the plating solutions, but economics dictate that the metal levels be maintained at the stated levels.

A second essential component of the baths of the present invention is at least one complexing agent selected from the group consisting of thiourea compounds and imidazole thiones. The thiourea compounds may be represented by the Formula I:

$$(R^1)(R^2)N-C(S)N(R^3)(R^4) \quad (I)$$

where
$R^1$, $R^2$, $R^3$ and $R^4$ are each independently
(1) H;
(2) alkyl or alkenyl groups having up to about 6 carbon atoms;
(3) aryl, aralkyl, or alkaryl groups having up to about 12 carbon atoms;
(4) cycloalkyl, cycloalkylalkyl, or alkylcycloalkyl groups having up to about 12 carbon atoms;
(5) $R^5$ C(X) where $R^5$ may be the same as groups (2) through (4) as defined above, and X is O or S; and
(6) $CH_2OH$.

Mineral acid salts of the thiourea compounds may also be used.

The thiourea compound used in the present invention comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); monalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or disubstituted thioureas such as naphthyl thiourea, diphenyl thiourea, cyclohexyl thiourea and the like, where the cyclic hydrocarbons have up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g., monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and $R^5OH$, ($R^5$ as defined above) especially where $R^5$ is lower alkyl; thioureadioxide (aka formamidinesulfinic acid [1758-73-2, C.A. Reg. No.]); the reaction product of a saturated or unsaturated aliphatic or cyclic organic acid having up to about 12 carbon atoms and especially the lower aliphatic monocarboxylic acid reaction products with thiourea e.g., acylthioureas, and the mineral acid salts of thiourea e.g., thiourea mono- or di-sulfate.

The imidazole-thiones useful in the baths of the invention include imidazole-2-thiones which are represented by the Formula II:

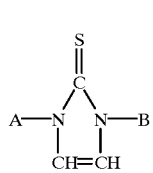

(II)

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as (where A is methyl or ethyl and B is an alkyl or cycloalkyl group containing from 3 to 6 carbon atoms). Preferably, when A is methyl, B is a $C_3$–$C_6$ alkyl or cycloalkyl group, and when A is ethyl, B is a $C_4$–$C_6$ alkyl or cycloalkyl group. An example of an unsymmetrical compound is 1-methyl-3-propylimidazole-2-thione.

Alternatively, symmetrical 1,3-dialkylimidazole-2-thione compounds may be used and the dialkyl groups are the same alkyl or cycloalkyl groups containing from 1 to 6 carbon atoms. An example of this class of complexing agents is 1,3-dimethylimidazole-2-thione.

The imidiazole-2-thione complexing agents are described in U.S. Pat. No. 5,554,211, issued to Bokisa et al. This patent is incorporated by reference for its disclosure of the thiones as well as immersion metal compositions and methods.

The amount of the complexing agent included in the plating baths may be varied over a wide range such as from about 5 g to about 120 grams per liter of bath. More often the baths will contain from about 10 to 100 grams/liter and preferably from about 15 to about 75 grams of the complexing agent per liter of bath. Preferably the complexing agent is thiourea.

When the solubility of the complexing agent in the plating bath is low, a cosolvent may be added to solubilize the complexing agent and thereby enhance its activity in the resulting bath. Suitable cosolvents include water-miscible solvents such as alcohols, (e.g., ethanol), glycols (e.g., ethylene glycol), alkoxy alkanols (e.g., 2-ethoxy ethanol), ketones (e.g., acetone), aprotic solvents (e.g., dimethyl formamide, dimethyl sulfoxide, acetonitrile, etc.), etc.

A third essential ingredient of the plating baths of the present invention is at least one amidine compound. The amidine compounds may be characterized by the Formula III:

$$RC(=NH)NH_2 \quad (III)$$

and the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

The acid salts include salts such as the formates, acetates, hydrochlorides, carbonates, etc. of such amidines. The aliphatic and alkyl groups contain from one to about 10 or more carbon atoms, whereas the alicyclic and aromatic (or aryl) groups contain from about 6 to about 20 or more carbon atoms, and the heterocyclic groups contain from about 4 to about 20 carbon atoms.

Examples of such amidines are as follows. The list is exemplary only and is not to be considered as a limitation on the above formula.

| | Formula | Name |
|---|---|---|
| R | | |
| Hydrogen | $H-C(=NH)NH_2$ | formamidine |
| Hydroxyl | $HO-C(=NH)NH_2$ | isourea |
| Aliphatic | $CH_3C(=NH)NH_2$ | ethanamidine |
| | $CH_3CH_2CH(CH_2CH_3)-CH_2CH_2C(=NH)NH_2$ | 4-ethylhexanamidine |
| Alicyclic | cyclohexyl–$C(=NH)NH_2$ | Cyclohexanecarboxamidine |
| | pyrrole–$C(=NH)NH_2$ | Pyrrole-2-carboxamidine |
| Heterocyclic | $H_2N(HN=)C$–(diazanaphthalene)–$C(=NH)NH_2$ | 2,6-diazanaphthalene-3,7-Dicarboxamide |
| Aromatic | naphthyl–$C(=NH)NH_2$ | 2-naphthamidine |
| | phenyl–$C(=NH)NH_2$ | Benzamidine |
| Amino | $H_2N-C(=NH)NH_2$ | guanidine |
| Aminoalkyl | $H_2NCH_2CH_2C(=NH)NH_2$ | 1-aminopropanamidine |
| Amidinoalkyl | $H_2N(HN=)C(CH_2)_3C(=NH)NH_2$ | pentanediamidine |
| Amidino | $H_2N(HN=)C-C(=NH)NH_2$ | ethanediamidine |
| Amidinoaryl | $H_2N(HN=)C-C_6H_4-C(=NH)NH_2$ | 1,4-benzenedicarboxamidine |
| Carboxyalkyl | $H_2N(HN=)C(CH_2)_3COOH$ | 4-carbaminidoylbutanoic acid |
| R$^1$ = | | |
| Aliphatic | $CH_3NH\ C(=NH)NH_2$ | methyl guanidine |
| Alicyclic | cyclohexyl–$NHC(=NH)NH_2$ | Cyclohexyl guanidine |
| Amidino | $H_2N(HN=)C-NH-C(=NH)NH_2$ | biguanide |
| Aminoalkyl | $H_2N(CH_2)_4NH-C(=NH)NH_2$ | aminobutylguanidine |
| Carboxylalkyl | $H_2N(HN=)C-NH-CH_2COOH$ | 3-guanidinoacetic acid |
| | $H_2N(HN=)C-NH-(CH_2)_2COOH$ | 3-guanidinobutanoic acid |
| amidoalkyl | $H_2N(HN=)C-NH-CH_2CH_2CONH_2$ | 3-guanidino propionamide |
| Heterocyclic | quinazoline–$NHC(=NH)NH_2$ | 2-guanidinobenzimidazole |

The amount of amidine compound included in the plating baths of the invention may vary over a wide range such as from about 1 gram per liter of bath up to about 100 grams per liter of bath. In a preferred embodiment, the range is from about 10 to about 75 grams per liter, and more often the range is from about 15 to about 60 grams per liter of bath.

The plating baths of the present invention also generally contain at least one acid. The acids which are particularly useful include inorganic and organic acids. In one embodiment, the acids are selected from the group consisting of mineral acids, fluoboric acid, alkane sulfonic acids, alkanol sulfonic acids, and mixtures thereof. The amount of acid contained in the solutions may vary from about 20 to about 400 grams of acid per liter of bath. More often, the plating baths will contain from about 80 to about 150 grams of acid per liter of baths. Sufficient acid is present in the aqueous plating solutions to provide the solution with a pH of from about 0 to about 3, more often from about 0 to about 2. Generally, as noted above, it is desirable to use an acid that has an anion common to the acid salts of the metals.

The acid included in the plating baths may be inorganic acids (mineral acids) based on sulfuric, phosphorus, or the halogens. Sulfuric acid and sulfamic acid are preferred sulfur based mineral acids. The organic acids useful in this invention include monocarboxylic as well as dicarboxylic acids having up to about six carbon atoms such as formic acid, acetic acid, malic acid and maleic acid. In one embodiment, it is preferred not to use halogen acids or halogen salts since halide residues may be produced in the metal coatings, and these salts may affect the electrical properties of the metal and may also promote corrosion.

The alkane sulfonic acids which are useful in the present invention as the anion of the metal salts or as the acid component may be represented by the following Formula IV $$RSO_3H \tag{IV}$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Metal salts of the individual alkane sulfonic acids or mixtures of any of the above alkane sulfonic acids can be utilized in the plating baths of the invention.

The alkanol sulfonic acids may be represented by the following Formula V:

$$C_nH_{2n+1}-CH(OH)-(CH_2)_m-SO_3H \tag{V}$$

wherein n is from 0 to about 10, m is from 1 to about 11 and the sum of m+n is from 1 up to about 12. As can be seen from the above Formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1-sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent. The metal salts of such acids are prepared, for example, by dissolving a metal oxide in a hot concentrated aqueous solution of an alkane or alkanol sulfonic acid. Mixtures of any of the above-described acids may be used, and an example of a useful mixture is a mixture of fluoboric acid and methane sulfonic acid.

It is within the scope of the invention to optionally include in the plating bath, one or more surfactants compatible with each of the bath soluble metal salts, the complexing agent, the acids and the amidine. Thus, the plating baths of the present invention may optionally contain at least one surfactant in a concentration of from about 0.01 to about 100 grams per liter of bath and more preferably from about 0.05 to about 20 grams per liter of bath. As noted above, the surfactant may be at least one surfactant including amphoteric, nonionic, cationic, or anionic surfactants; or mixtures thereof. More often, the surfactant is at least one cationic or anionic surfactant; or mixtures thereof. The nonionic surfactants are preferred.

A variety of nonionic surfactants which can be utilized in the present invention are the condensation products of ethylene oxide and/or propylene oxide with compounds containing a hydroxy, mercapto or amino group containing at least one N—H. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants useful in the plating baths of the invention include ether containing surfactants having the Formula VI:

$$R-O-[(CH_2)_nO]_xH \tag{VI}$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations "Surfynol" by Air Products and Chemicals, Inc. of Wayne, Pa., under the designation "Pluronic" or "Tetronic" by BASF Wyandotte Corp. of Wyandotte, Mich., and under the designation "Surfonic" by Huntsmern Corporation of Houston, Tex. Examples of specific polyoxyethylene condensation products useful in the invention include "Surfynol 465" which is a product obtained by reacting about 10 moles of ethylene oxide with 1 mole of tetramethyldecynediol. "Surfynol 485" is the product obtained by reacting 30 moles of ethylene oxide with tetramethyldecynediol. "Pluronic L 35" is a product obtained by reacting 22 moles of ethylene oxide with polypropylene glycol obtained by the condensation of 16 moles of propylene oxide. Surfonic N-150 is an ethoxylated alkylphenol.

Alkoxylated amine, long chain fatty amine, long chain fatty acid, alkanol amines, diamines, amides, alkanol amides and polyglycoltype surfactants known in the art are also useful. One type of amine surfactant found particularly useful in the immersion baths is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants which are polyethylene glycols having different molecular weights also are useful. For example Carbowax No. 1000 has a molecular weight range of from about 950 to 1050 and contains from 20 to 24 ethoxy units per molecule. Carbowax No. 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful nonionic surfactants. Many of these are available commercially such as under the general tradename "Ethofat" from Armak Ind. Examples include condensate of coco acids, oleic acid, etc. Ethylene oxide condensates of fatty acid amides, e.g., oleamide, also are available from Armak Ind.

In some of the baths, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as "Tween" from ICI America, "Triton" from Rohm & Haas Co., "Tergitol" from Union Carbide, and "Igepal" from General Aniline and Film Corp.

The surfactants utilized in the immersion plating baths of the present invention also may be amphoteric surfactants. The preferred amphoteric surfactants include betaines and sulfobetaines, and sulfated or sulfonated adducts of the condensation products of ethylene oxide and/or propylene oxide with an alkyl amine or diamine.

Typical betaines include lauryidimethylammonium betaine and stearyl dimethylammonium betaine. Sulfated and sulfonated adducts include Triton QS-15 (Rohm & Haas Co.), a sulfated adduct of an ethoxylated alkylamine, Miranol HS, a sodium salt of a sulfonated lauric derivative, Miranol OS, a sodium salt of a sulfonated oleic acid, etc. Cationic surfactants also are useful in the plating baths of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following Formula VII:

wherein R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized in the baths of the invention are represented by the Formulae VIII and IX:

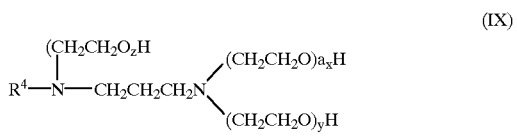

wherein $R^4$ is a fatty acid alkyl group containing from 12 to 18 carbon atoms, and x, y and z are as defined in Formula VII.

The above described cationic surfactants are known in the art and are available from a variety of commercial sources. The surfactants of the type represented by Formula VIII can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating baths of the invention can be prepared as mentioned above, by condensing alkylene oxides with the above-described primary amines by techniques known to those in the art. A number of such alkoxylated amines is commercially available from a variety of sources.

The above described amines can be prepared, as mentioned above, by condensing alkylene oxides with the above-described primary amines by techniques known to those in the art. A number of such alkoxylated amines are commercially available from a variety of sources. The alkoxylated amines of the type represented by Formula VI are available from the Armak Chemical Division of Akzona, Inc., Chicago, Ill., under the general trade designation "Ethomeen". Specific examples of such products include "Ethomeen C/15" which is an ethylene oxide condensate of a coconut fatty amine containing about 5 moles of ethylene oxide; "Ethomeen C/20" and "C/25" which also are ethylene oxide condensation products from coconut fatty amine containing about 10 and 15 moles of ethylene oxide respectively; "Ethomeen S/15" and "S/20" which are ethylene oxide condensation products with stearyl amine containing about 5 and 10 moles of ethylene oxide per mole of amine respectively; and "Ethomeen T/15" and "T/25" which are ethylene oxide condensation products of tallow amine containing about 5 and 15 moles of ethylene oxide per mole of amine respectively. Commercially available examples of the alkoxylated amines of the type represented by formula (5) include "Ethoduomeen T/13" and "T/20" which are ethylene oxide condensation products of N-tallow trimethylene diamine containing about 3 and 10 moles of ethylene oxide per mole of diamine respectively. Another type of useful cationic surfactant is represented by the Formula X:

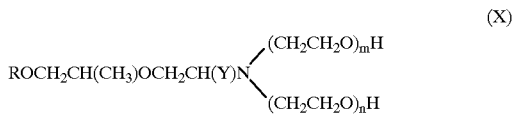

where R is an alkyl group containing from about 8 to about 12 carbon atoms, Y is a methyl or a hydroxyl group, m and n are integers, the sum of which is from about 2 to about 20.

The amine ethoxylate surfactants of the type represented by Formula X exhibit the characteristics of both cationic and nonionic surfactants with the nonionic properties increasing at the higher levels of ethoxylation. That is, as the sum of x and y increases, the ethoxylated amine behaves more like a nonionic surfactant.

The surfactants represented by Formula X wherein Y is a methyl group are available commercially such as from Texaco Chemical Company under the trade designation "M-300 Series". The M-300 Series compounds currently available from Texaco and which have been found to be useful in the aqueous acid plating baths of the invention include those designated as M-302, M-305, M-310, M-315 and M-320 which contain a total to 2, 5, 10, 15 and 20 moles of ethylene oxide respectively. In all of these compounds, R is a mixture of 10 and 12 carbon alkyl groups.

The cationic surfactant also may be:

(a) a quaternary ammonium salt of the Formula XI:

wherein X represents a halogen, a hydroxyl group, or the residue of a $C_{1-5}$ alkanesulfonic acid; $R_1$ represents alkyl group R' and R" represent a $C_{1-4}$ alkyl group; and R'" represents a $C_{1-10}$ alkyl group or a benzyl group;

(b) pyridinium salts represented by the general Formula XII:

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general Formula XIII:

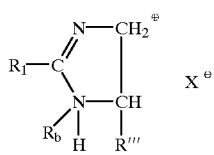

wherein X represents a halogen, a hydroxyl group, or the residue of a $C_{1-10}$ alkanesulfonic acid; $R_1$ represents a $C_{8-20}$ alkyl group; $R_b$ represents a hydroxy-containing $C_{1-5}$ alkyl group; and R'" represents a $C_{1-10}$ alkyl group or a benzyl group; and (d) higher alkyl amine salts represented by the general Formula XIV:

$$[R_1-NH_3]^{(+)}CH_3-(CH_2)_n-COO^{(-)} \quad (XIV)$$

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryidimethylethylammonium salt, octadecyldimethylethylammonium salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (Siponate DS), etc.

The plating solutions of the present invention may also contain one or more chelating agents useful in keeping the displacement and/or displaced metal in solution. The chelating agents which are useful in the solutions of the present invention generally comprise the various classes of chelating agents and specific compounds disclosed in Kirk-Othmer, Encyclopedia of Chemical Technology, Third Edition, Vol. 5, pp. 339–368. This disclosure is hereby incorporated by reference. Chelating agents that are especially preferred comprise polyamines, aminocarboxylic acids and hydroxy carboxylic acids. Some aminocarboxylic acids that may be used comprise ethylenediaminetetraacetic acid, hydroxyethyletylenediaminetriacetic acid, nitrilotriacetic acid, N-dihydroxyethylglycine, and ethylenebis (hydroxyphenylglycine). Hydroxy carboxylic acids that may be used comprise tartaric acid, citric acid, gluconic acid and 5-sulfosalicylic acid. Other useful chelating agents include polyamines such as ethylene diamine, dimethylglyoxime, diethylenetriamine, etc.

Various reducing agents that may be included in the plating solutions, and these generally include organic aldehydes whether saturated or unsaturated, aliphatic or cyclic, having up to about 10 carbon atoms. Lower alkyl aldehydes having up to about 6 carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to prevent oxidation of the metal salts to a higher oxidation state, e.g., tin (II) ion to tin (IV) ion, but also as a chelating agent and is especially useful for these reasons. Other useful reducing agents include hypophosphorous acid, dimethylamino borane, etc.

The plating solutions also may contain urea or a urea derivative, homologe or analog thereof. However, one of the advantages of the present invention is that urea or a urea derivative is not required in the plating baths of this invention. Examples of useful urea derivatives are found in Cols. 14–15 in Holtzman et al, U.S. Pat. No. 4,657,632, which is incorporated herein by reference. Specific examples include urea nitrate, urea oxalate, 1-acetylurea, 1-benzylurea, 1-butylurea, 1,1-diethylurea, 1,1-diphenylurea, 1-hydroxyurea, etc. As noted above, however, in one preferred embodiment, the plating solutions of this invention are substantially free of urea and urea derivatives.

The various components of the aqueous immersion plating solutions of the invention may be present at the concentrations described above. In one preferred embodiment, the immersion plating solutions will contain:

(A) from about 1 to about 70 grams per liter of at least one metal selected from the group consisting of tin, lead and bismuth;

(B) from about 5 to about 120 grams per liter of a thiourea compound;

(C) from about 1 to about 100 grams per liter of an amidine compound characterized by the formula $R(C=NH)NH_2$ or the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

(D) from about 20 to about 400 grams per liter of at least one acid selected from the group consisting of mineral acids, fluoroboric acid, alkane sulfonic acids, alkanol sulfonic acids, and mixtures thereof; and (E) water.

The solution concentrations may, of course, vary depending on the particular plating application intended.

The plating solutions of this invention can be prepared by adding the components to water. The components can be added in any order.

The aqueous immersion plating baths of the invention may be utilized in the plating of substrates such as copper, copper alloys, and other metals by chemical displacement using an immersion, a spray, a flood or a cascade application process. Preferably, metal substrates are contacted with the plating solutions by immersing or dipping the substrates into the plating solutions maintained at a temperature of from about 15° C. to about 70° C. More often, the temperature of the plating solution is in the range of from about 25° C. to about 35° C. The metal substrate to be plated generally is maintained in the bath for about 1 to about 5 minutes to provide the desired plate quality and thickness such as plating thicknesses of from about 1 to about 10 microns. The plating solutions may be stirred mechanically or ultrasonically to accelerate the displacement reaction. The plates produced with the plating solutions of the invention are dense and adhere tightly to the underlying metal substrate. As noted above, the plates deposited with the above plating solutions may be tin, lead, or bismuth, indium, gallium, or germanium or alloys of any two or more of said metals.

The following examples illustrate the plating solutions of the present invention. Unless otherwise indicated in the following examples and elsewhere in the specification and claims, all parts and percentages are by weight, temperatures are in degrees centigrade, and pressure is at or near atmospheric pressure.

The utility of the plating solutions of the present invention in depositing metal coatings on a metal substrate is demonstrated by immersing an electrodeposited copper foil in the solutions of the examples for one minute. Mild mechanical bath agitation is employed, and the bath temperature is maintained at about 25° C. to about 35° C. The results of the plating tests are reported in the examples.

EXAMPLE 1

|  | g/l |
| --- | --- |
| tin as stannous sulfate | 10 |
| sulfuric acid | 175 |
| thiourea | 60 |
| guanidine sulfate | 40 |
| water | to 1 liter |

A bright, uniform, non-porous tin deposit is obtained.

EXAMPLE 2

|  | g/l |
| --- | --- |
| tin as stannous sulfate | 5 |
| sulfuric acid | 175 |
| thiourea | 60 |
| benzamidine hydrochloride | 40 |
| water | to 1 liter |

A bright, uniform, non-porous tin deposit is obtained.

EXAMPLE 3

|  | g/l |
| --- | --- |
| tin as stannous methane sulfonate | 20 |
| methane sulfonic acid | 95 |
| thiourea | 80 |
| amidinothio-1-propane-sulfonic acid | 40 |
| water | to 1 liter |

A bright, uniform, non-porous tin deposit is obtained.

EXAMPLE 4

|  | g/l |
| --- | --- |
| tin as stannous methane sulfonate | 10 |
| lead as plumbous methane sulfonate | 10 |
| methane sulfonic acid | 50 |
| thiourea | 60 |
| guanidine sulfate | 20 |
| water | to 1 liter |

A semi-bright, uniform, non-porous tin/lead alloy deposit is obtained.

EXAMPLE 5

|  | g/l |
| --- | --- |
| tin as stannous fluorborate | 5 |
| bismuth as bismuth methane sulfonate | 5 |
| fluoboric acid | 40 |
| thiourea | 40 |
| guanidine sulfate | 50 |
| water | to 1 liter |

A semi-bright, uniform, non-porous tin/bismuth alloy deposit is obtained.

The coatings deposited from the plating solutions of the invention are useful in the fabrication of electronic circuits, electronic devices and electrical connectors. The surface layers of tin, lead, bismuth and alloys thereof can be used as protective layers to prevent corrosion of copper in a patterning procedure during the fabrication of printed circuits or integrated circuits. The coatings also provide chemically stable surfaces for soldering on printed wireboards, etc.

The plating solutions of the present invention are useful in the manufacture of multilayer printed circuitboards which have alternating layers of dielectric material which support copper circuitry (which may have other layers such as a copper sheet interspaced which serves as a ground plane) which are adhered to an insulating layer through intermediate layers. The circuitboard has conductive through holes which form electrical paths across the entire thickness of the board. Multilayer circuitboards may comprise several dozen conductive and non-conductive layers. In the formation of multilayer circuitboards, it is often necessary to drill holes through the boards, and defects can occur due to delamination of layers in the areas immediately surrounding a hole.

A starting material is a dielectric layer which contains a cladding of copper on one or both surfaces. The copper layer is of a thickness of at least 4 microns and more preferably about 32 microns, and the copper layer is used to form conductive circuitry. Well known techniques can be employed to form such circuitry. The composition of the dielectric layer is not critical provided it functions as an electrical insulator. After formation of the conductive circuitry, a thin outer layer of tin, lead or bismuth, or mixtures of two or more of such metals is formed on the circuitry. The circuitry of the printed circuitboard typically is first cleaned and etched before it is contacted with the plating solutions of the present invention such as by immersing the printed circuitboard in the plating solutions of the present invention. It has been observed, however, that the plating baths of the present invention are effective in cleaning the copper circuitry so that less sample preparation (cleaning) is required.

As mentioned above, one of the difficulties encountered in the manufacture of multilayer circuit boards is the low bonding strengths sometimes obtained between the prepreg and the metal surface of a circuit board in the array or boards that make up the multilayer circuit board. These problems are observed particularly, when the metal layer comprises copper. The bonding between the copper clad board and the prepreg is improved by plating the copper substrate with the plating baths of the present invention. It has also been observed that the adhesion of copper or copper alloy substrates to organic material such as prepregs can be further improved by incorporating a copper complex into the plating baths of the present invention. The copper complex generally is added to the plating baths in an amount of from about 1 gram per liter up to the solubility limit of the copper complex in the bath. The amount of copper metal present in the bath may range from about 0.5 g/l up to the solubility limit of copper metal. The copper complex which may be added to the plating baths includes copper complexes of the complexing agents described above or a combination of one or more of the above-described complexing agents with one or more acids. In one preferred embodiment, the copper complex is a copper thiourea or a copper imidazole-2-thione.

The presence of the copper in the plating solutions of the present invention also containing tin, lead, bismuth, indium, gallium, and germanium results in the formation of a cocontinuous bond when the treated copper substrate is bonded to an organic material. The term cocontinuous bond refers to the structure which results when the treated copper substrate is bonded to an organic material. The resulting structure is cocontinuous because neither the organic material nor the copper surface are discontinuous. The treated copper surface has interconnected channels and depressions, and the organic material flows into the channels and depressions. In the resulting bond, neither the copper surface nor the organic material are discontinuous. For example, a cocontinuous bond is obtained when the bath of Example 1 is saturated with 5 grams per liter of copper thiourea sulfate (CTS), and the bath is sprayed onto a copper clad substrate which is a standard inner layer stock. The resulting copper surface has interconnected channels and depressions which will facilitate the formation of cocontinuous bonds when bonded to an organic material.

The plating baths of the present invention containing the above described amidines, exhibit improved copper holding power. That is, the solubility of copper in the plating baths is increased by the presence of the amidine, and the copper remains soluble or suspended in the plating bath. The increased solubility of copper and the plating baths of the present invention is demonstrated in the following tests. A stock solution comprising 10 grams per liter of stannous ion, 60 grams per liter of thiourea, 10% v/v sulfuric acid and water is prepared as a control. Several samples of the stock solution where obtained, and 40 grams of urea or one of the amidines identified below were added to the stock solution. Copper thiourea sulfate (50 grams per liter) is then added to each sample, and the mixtures are heated to 95° C. to solubilize the CTS. These mixtures are then allowed to cool to room temperature thereby precipitating the non-soluble CTS. Atomic absorption analysis of the cooled solutions is then performed to determine copper solubility. The results are summarized in the following table.

| Compound Screened | Copper Solubility (g/l) |
|---|---|
| stock solution (no urea or amidine) | 1.9 |
| stock solution plus | |
| urea | 2.1 |
| guanidine sulfate | 2.3 |
| formamidine sulfinic acid | 8.0 |
| amidinothio-1-propane-sulfonic acid | 4.6 |
| 2-imidino-4-thiobiuret | 3.9 |
| benzamidine hydrochloride | 5.3 |

The above results indicate that urea increases the copper holding power of the stock solution and that the solution containing the guanidine sulfate exhibits a slight improvement in holding power. The test solutions containing the other amidines show a marked increase in copper holding power.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. An aqueous immersion plating bath comprising:
   (A) at least one bath-soluble metal salt selected from the group consisting of stannous salts, lead salts, bismuth salts, indium salts, gallium salts, and germanium salts;
   (B) at least one complexing agent selected from the group consisting of thiourea compounds and imidazole thiones, and
   (C) at least one amidine.

2. The plating bath of claim 1 wherein the metal salt (A) comprises a stannous salt.

3. The plating bath of claim 1 wherein the metal salt (A) comprises a mixture of a stannous salt and at least one other salt selected from a lead salt and a bismuth salt.

4. The plating bath of claim 1 wherein the complexing agent is a thiourea.

5. The plating bath of claim 1 wherein the complexing agent is an imidazole thione characterized by the formula

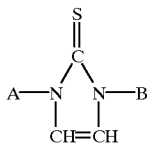 (II)

wherein A and B are the same or different -RY groups wherein R is a linear, branched or cyclic hydrocarbylene group containing up to 12 carbon atoms, and Y is hydrogen, halogen, cyano, vinyl, phenyl or ether moiety.

6. The plating bath of claim 1 wherein the amidine is characterized by the Formula III $$R(C=NH)NH_2 \qquad (III)$$

or the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

7. The aqueous plating bath of claim 1 wherein the amidine is guanidine or a guanidine salt.

8. The plating bath of claim 1 also comprising at least one acid.

9. The plating bath of claim 8 wherein the acid is selected from the group consisting of mineral acids, fluoroboric acid, alkane sulfonic acids, alkanol sulfonic acids, and mixtures thereof.

10. The plating bath of claim 8 wherein the acid is a mineral acid.

11. The plating bath of claim 10 wherein the mineral acid is sulfuric acid.

12. The aqueous plating bath of claim 8 wherein the acid is an alkane sulfonic acid represented by the formula $$RSO_3H \qquad (IV)$$

wherein R is an alkyl group containing 1 to about 12 carbon atoms, or an alkanol sulfonic acid represented by the formula $$CnH_{2n+1}CH(OH)CH_2)_m—SO_3H \qquad (V)$$

wherein n is from 0 to about 10, m is from 1 to about 11, and the sum of n+m is from 1 to about 12.

13. The plating bath of claim 12 wherein the acid is an alkane sulfonic acid of Formula IV.

14. An aqueous immersion plating bath for depositing one or more metals selected from the group consisting of tin, lead, bismuth, indium, gallium, and germanium onto a metal surface comprising:
   (A) at least one bath-soluble metal salt selected from the group consisting of stannous salts, lead salts, bismuth salts, indium salts, gallium salts, and germanium salts;
   (B) a thiourea compound;
   (C) at least one amidine;
   (D) at least one acid; and
   (E) water.

15. The plating bath of claim 14 wherein the metal salt (A) comprises a stannous salt.

16. The plating bath of claim 14 wherein the metal salt (A) comprises a mixture of a stannous salt and at least one other salt selected from a lead salt and a bismuth salt.

17. The plating bath of claim 14 wherein the amidine is characterized by the Formula III $$R(C=NH)NH_2 \qquad (III)$$

or the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

18. The plating bath of claim 14 wherein the amidine is guanidine or a guanidine salt.

19. The plating bath of claim 14 wherein the acid is selected from the group consisting of mineral acids, fluoroboric acid, alkane sulfonic acids, alkanol sulfonic acids, and mixtures thereof.

20. The plating bath of claim 14 wherein the acid is a mineral acid.

21. The plating bath of claim 20 wherein the mineral acid is sulfuric acid.

22. The plating bath of claim 14 wherein the acid is an alkane sulfonic acid represented by the formula $$RSO_3H \qquad (IV)$$

wherein R is an alkyl group containing 1 to about 12 carbon atoms, or an alkanol sulfonic acid represented by the formula

$$CnH_{2n+1}CH(OH)CH_2)_m—SO_3H \quad (V)$$

wherein n is from 0 to about 10, m is from 1 to about 11, and the sum of n+m is from 1 to about 12.

23. The plating bath of claim 22 wherein the acid is an alkane sulfonic acid of formula IV.

24. The plating bath of claim 14 wherein the thiourea compound is thiourea.

25. The plating bath of claim 14 also containing at least one surfactant.

26. The plating bath of claim 14 wherein the metal surface is a copper surface or a copper alloy surface.

27. An aqueous immersion plating bath for depositing one or more metals selected from the group consisting of tin, lead and bismuth onto a metal surface comprising:

(A) from about 1 to about 70 grams per liter of at least one metal selected from the group consisting of tin, lead and bismuth;

(B) from about 5 to about 120 grams per liter of a thiourea compound;

(C) from about 1 to about 100 grams per liter of an amidine compound characterized by the formula $R(C=NH)NH_2$ or the acid salts thereof wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl groups;

(D) from about 20 to about 400 grams per liter of at least one acid selected from the group consisting of mineral acids, fluoroboric acid, alkane sulfonic acids, alkanol sulfonic acids, and mixtures thereof; and (E) water.

28. The plating bath of claim 27 also comprising at least one surfactant.

29. The plating bath of claim 27 also comprising at least one copper salt.

30. The plating composition of claim 29 wherein the copper salt is a copper thiourea salt.

31. A process for improving the adhesion properties of a metal layer of a circuit board to a non-conductive surface of a circuit board comprising coating said metal layer with one or more metals selected from the group consisting of tin, lead, bismuth, indium, gallium and germanium by immersion plating of the metal surface in the aqueous plating bath of claim 1.

32. A process for improving the adhesion properties of a metal layer of a circuit board to a non-conductive surface of a circuit board comprising coating said layer with one or more metals selected from the group consisting of tin, lead and bismuth by immersion plating of the metal surface in the aqueous plating bath of claim 27.

33. A metal surface which is plated with one or more metals selected from the group consisting of tin, lead, bismuth, indium, gallium and germanium by immersion plating of the metal surface with an aqueous plating bath of claim 1.

34. A metal surface which is plated with one or more metals selected from the group consisting of tin, lead and bismuth by immersion plating of the metal surface with an aqueous plating bath of claim 27.

* * * * *